United States Patent [19]

Ikeda et al.

[11] Patent Number: 5,434,024
[45] Date of Patent: Jul. 18, 1995

[54] ELECTRODE

[75] Inventors: Hironosuke Ikeda, Hirakata; Mitsuyasu Kubo; Jiro Okuda, both of Tokyo, all of Japan

[73] Assignee: C. Uyemura & Co., Ltd., Osaka, Japan

[21] Appl. No.: 93,921

[22] Filed: Jul. 21, 1993

[30] Foreign Application Priority Data

Apr. 14, 1993 [JP] Japan ................................. 5-111105

[51] Int. Cl.$^6$ ............................................. H01M 4/72
[52] U.S. Cl. ................................. 429/234; 429/233; 429/245; 429/194
[58] Field of Search ............... 429/234, 238, 245, 233, 429/241, 194

[56] References Cited

U.S. PATENT DOCUMENTS

| | | | |
|---|---|---|---|
| 4,356,242 | 10/1982 | Doniat | 429/234 |
| 4,687,719 | 8/1987 | Von Benda et al. | 429/234 |
| 5,246,797 | 9/1993 | Imhof et al. | 429/234 X |

*Primary Examiner*—John S. Maples
*Attorney, Agent, or Firm*—Sughrue, Mion, Zinn, Macpeak & Seas

[57] ABSTRACT

Metal is deposited on a three-dimensional network plastic substrate having internal open cells by a gas phase plating technique to form a metal layer covering all three-dimensional network lattice surface to form a support. An active material is carried on the support to form an electrode. The electrode is improved in active material-support adhesion, allows the amounts of conductive agent and binder to be reduced, and provides a cell with improved performance. It is especially useful in a secondary lithium cell.

9 Claims, 4 Drawing Sheets

ELECTRODE

BACKGROUND OF THE INVENTION

1. Field of the Invention

This invention relates to an electrode having an active material borne on a support having a three-dimensional network structure having interconnected spaces, at least the surface of the three-dimensional network skeleton being formed of a metal, especially aluminum. The electrode is useful as a positive electrode in secondary cells, especially secondary lithium cells and secondary lithium ion cells.

2. Prior Art

Positive electrode materials commonly used in prior art secondary lithium cells and secondary lithium ion cells include electrode supports in the form of metal thin plates such as stainless steel thin plates and aluminum thin plates, having an active material borne thereon. Commonly used among the active materials for the positive electrodes of secondary lithium cells are manganese dioxide, cobalt oxide, and titanium sulfide. Such an active material is blended with a binder together with an electrically conductive agent such as graphite and carbon to form an active material paste which is coated to a support as mentioned above to form a positive electrode. The positive electrode is laid on a lithium base negative electrode through a separator. The assembly, optionally after spirally wound, is impregnated with a non-aqueous electrolyte solution between the positive and negative electrodes to construct a secondary lithium cell.

In a secondary lithium ion cell, the positive electrodes is composed of lithium-metal complex oxide such as $LiCoO_2$ carried on aluminum sheet and the negative electrode is composed of graphite carbon carried on copper sheet.

Such secondary lithium cells and secondary lithium ion cells have been used in practice although there is a need for further improvements in repeatable charge-discharge cycles, discharge electric capacity and electric power.

These cell performance factors can be increased by improving positive electrode materials. Prior art positive electrodes have active materials borne on supports in the form of thin plates of metals such as stainless steel and aluminum. All these electrode supports are not well adherent to active materials such as manganese dioxide, cobalt oxide, titanium sulfide and $LiCoO_2$. The active materials are then susceptible to uneven deterioration, resulting in less charge-discharge cycle. If the amounts of the binder and conductive agent are increased in order to improve adhesion and conductivity, there is an accompanying lowering of discharge electric capacity and electric power. It will then be possible to improve such factors of secondary lithium cells and secondary lithium ion cells as repeatable charge-discharge cycle, discharge electric capacity and electric power by reducing the amounts of the binder and conductive agent in the positive electrode and improving the adhesion between the electrode support and the active material.

SUMMARY OF THE INVENTION

Therefore, an object of the present invention is to provide a novel and improved electrode which has improved adhesion between the support and the active material, contains reduced amounts of conductive agent and binder and allows a cell associated therewith to exert improved performance. Another object of the present invention is to provide such an electrode adapted for use in secondary cells, especially secondary lithium cells and secondary lithium ion cells.

A further object of the present invention is to provide a secondary cell having improved performance.

We have found that when a three-dimensional network plastic substrate having internal open cells, for example, polyester non-woven fabric is coated with a metal, especially aluminum, by a vapor phase plating technique, typically arc ion plating to form a metal layer covering all lattice surface of the substrate, there is obtained a metallized porous product which becomes a useful support as such or after removing the plastic substrate therefrom. The support is filled with an active material, resulting in an electrode having the active material borne on the support. The electrode features improved adhesion of the active material and reduced amounts of conductive agent and binder used. When used in a cell, the electrode allows for more mobility or fluidity to the electrolyte intervening between the positive and negative electrodes and provides improvements in cell performance. When used in secondary cells, especially secondary lithium cells and secondary lithium ion cells, the electrode serving as a positive electrode is effective for improving cell performance including repeatable charge-discharge cycles, discharge electric capacity and electric power.

According to the present invention, there is provided an electrode comprising a support and an active material borne thereon. The support is prepared by depositing a metal, especially aluminum, on a three-dimensional network plastic substrate having internal open cells by a vapor phase plating technique to form a metal layer covering all three-dimensional network lattice surface extending from the outside surface to the deepest center of the substrate and optionally removing the substrate.

The present invention also provides a secondary cell comprising a positive electrode, a negative electrode and an electrolyte, characterized in that the positive electrode is composed of a positive active material carried on a support prepared by depositing a metal, especially aluminum, on a three-dimensional network plastic substrate having internal open cells by a vapor phase plating technique to form a metal layer covering all three-dimensional network lattice surface extending from the outside surface to the deepest center of the substrate. The term network is used herein to encompass reticulated, porous, woven fabric, on-woven fabric and other analogous structures.

DETAILED DESCRIPTION OF THE INVENTION

Figure 1:
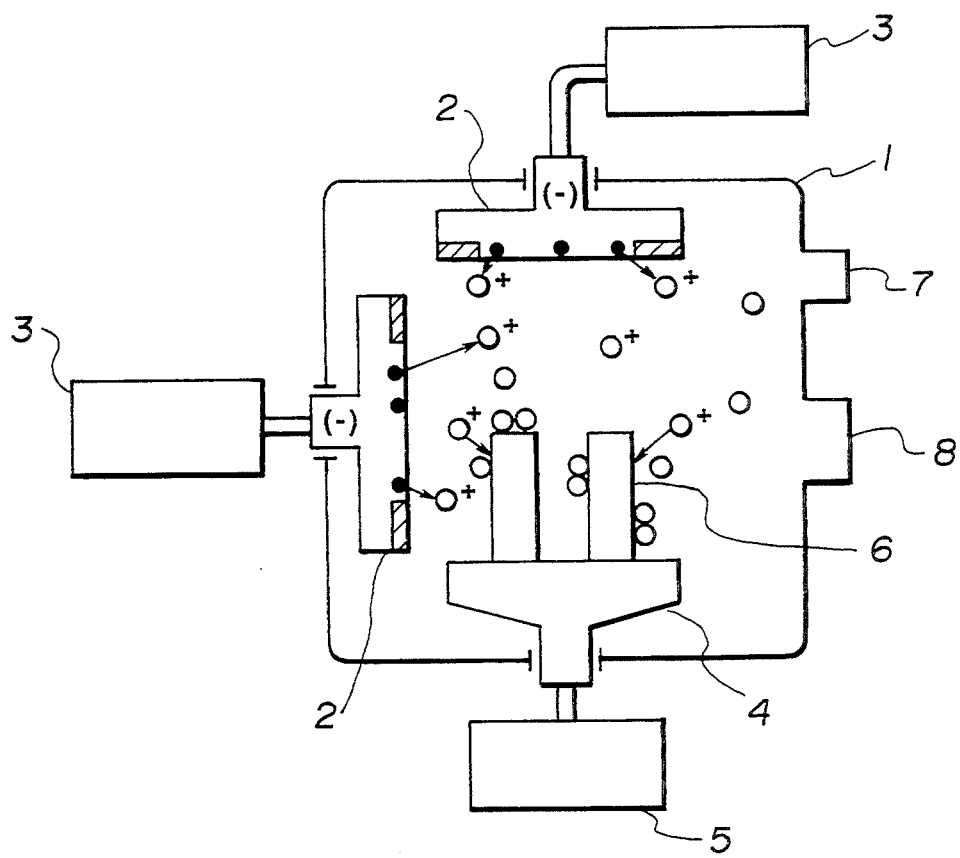
FIG. 1 schematically illustrates an exemplary arc ion plating system for use in the practice of the invention.

The electrode of the present invention has an active material borne on a support. The support is prepared by depositing a metal on a three-dimensional network plastic substrate having internal open cells by a vapor phase plating technique to form a metal layer covering all lattice surface of the substrate. There is obtained a metallized porous product which is the support. Alternatively, the plastic substrate is removed from the metallized porous product to provide the support.

The plastic substrate which is of a three-dimensional network structure having internal open cells is not critical although plastic fiber non-woven fabrics and expanded plastics are generally used. Examples of the plastic fiber non-woven fabric include non-woven fabrics of plastic fibers such as polypropylene and polyesters. Any of expanded plastics having continuous interconnected cells may be used although expanded plastics free of cell membrane and consisting essentially of skeleton lattices are preferred. For example, polyurethane foams free of cell membrane (often referred to as reticulated polyurethane) are preferred and open cell foams of polystyrene, polyvinyl chloride, polyethylene, polyisocyanate, polyphenol and polypropylene are also advantageously used.

The pore and overall sizes of the network plastic substrate are suitably selected in accordance with the size, shape and type of the intended electrode although it generally has an average pore diameter of 10 to 500 $\mu$m, preferably 30 to 200 $\mu$m, more preferably 50 to 100 $\mu$m and a thickness of 0.05 to 1 mm, preferably 0.1 to 0.5 mm, more preferably 0.1 to 0.2 mm.

The metal of which the metal layer covering the lattice surface of the network plastic substrate is made may be any desired one insofar as it is well electrically conductive and can form a coating by a vapor phase plating technique. Exemplary metals are aluminum, copper and nickel. Preferred among these is aluminum because it is lightweight, inexpensive, susceptible to deposition by a gas phase plating technique, and amenable to an arc ion plating technique as will be described later. It is advantageous to use aluminum for the positive electrode and copper for the negative electrode.

By forming a metal layer over the entire skeleton lattice surface of the network plastic substrate, there is obtained a support for constituting the electrode of the invention. The metal layer is formed by depositing a metal on the network plastic substrate by a vapor phase plating technique. The vapor phase plating techniques used herein include physical vapor deposition (PVD) techniques such as vacuum deposition, sputtering, ion plating, ion beam deposition and ion implantation as well as various chemical vapor deposition (CVD) techniques, with arc ion plating being preferred. The use of arc ion plating ensures that even when the network plastic substrate has a small average pore diameter, low voids and a relatively increased thickness, a uniform, relatively thick, strong metal layer is formed at a high deposition rate, in firm adhesion and over the entire lattice surface including a lattice surface at the deepest core. The resulting metal layer has a rugged surface sufficient to firmly retain and bond the active material.

More particularly, the arc ion plating technique is a technique of coating a workpiece surface with a metal film by subjecting a metal target or cathode to an arc discharge in vacuum for evaporation. Since the cathode as a whole remains solid during the process, it is possible to use one or more cathodes at any desired position within a plating apparatus or vacuum chamber. The cathode may be formed to any desired shape such as a round rod and gives off metal vapor from its entire surface. Then by selecting the location and shape of an aluminum cathode, aluminum can be evaporated from the cathode in a random or three-dimensional fashion. Then even when the network plastic substrate is a plastic foam or plastic fiber non-woven fabric having a thickness of about 2 to 10 mm, a metallic aluminum layer can uniformly deposit on the substrate not only on lattice surfaces near the outside surface of the substrate, but also on lattice surfaces at the deepest core of the substrate. An aluminized porous product is obtained in this way.

In order that the aluminized porous product fully exert the effect of aluminum, the aluminum layer must be thick enough. Also when an aluminized porous product having lattices consisting of aluminum is prepared by forming an aluminum layer on a network plastic substrate and thereafter removing the substrate, the aluminum layer must be as thick as several microns or more from the point of view of strength on use.

Conventional vapor phase plating techniques produce coating of several microns thick by repeating the deposition step several times. In contrast, the arc ion plating technique can form a thick aluminum layer of several microns or more in a single step even onto lattices at the deepest core of a relatively thick network plastic substrate of about 2 to 10 mm thick. A thick aluminum coating can be formed readily, uniformly and quickly. Therefore, the arc ion plating technique ensures simple efficient formation of a uniform thick aluminum coating over the entire lattice surface of a network plastic substrate. For this reason, the arc ion plating technique is advantageously used in the preparation of an aluminized porous product.

Furthermore, quite unexpectedly, the aluminum layer formed by the arc ion plating technique firmly adheres to the substrate or base and has sufficient strength to sustain itself even after the network plastic substrate is removed.

As previously described, the arc ion plating technique is defined herein as subjecting an aluminum target or cathode to an arc discharge in vacuum to evaporate aluminum and depositing metallic aluminum vapor onto a network plastic substrate. For the detail of the arc ion plating technique, reference is made to Japanese Patent Publication (JP-B) No. 5228/1987 or U.S. Pat. No. 4,351,855.

Referring to FIG. 1, there is schematically illustrated an exemplary system for depositing aluminum on a network plastic substrate by an arc ion plating technique. The system includes a reactor or vacuum chamber 1, aluminum targets or cathodes 2, arc power supplies 3 connected to the cathodes 2, a rotating table 4, and a biasing power supply 5 connected to the table 4. With network plastic substrates 6 resting on the table 4, the power supplies are actuated to generate an arc discharge for evaporating aluminum vapor from the targets 2 and depositing it on the network plastic substrates 6. The chamber 1 has a gas inlet 7 which is optional and a gas outlet 8.

The location and shape of the aluminum targets 2 are selected such that aluminum vapor may deposit on the substrates 6 randomly or in a three-dimensional fashion. For example, the targets 2 may be formed into round rods and located so as to surround the substrates 6.

Figure 2:
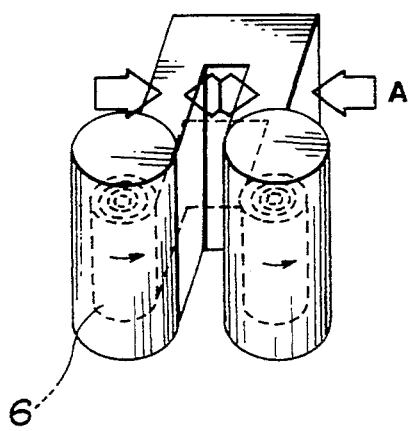
FIG. 2 is a schematic perspective view of one exemplary process for continuous treatment of a network plastic substrate.
Figure 3:
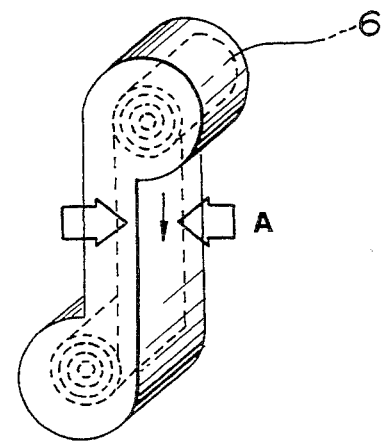
FIG. 3 is a schematic perspective view of another exemplary process for continuous treatment of a network plastic substrate.

FIGS. 2 and 3 schematically illustrate exemplary processes for continuously depositing aluminum on a network plastic substrate 6. In these examples, a roll of the substrate is received in a container at one end. The substrate 6 is continuously unraveled from the supply roll, passed through a treating zone A where aluminum deposition occurs, and taken up on a roll at the other end of the container.

The conditions for arc ion plating may be suitably selected and generally include a vacuum of about $10^{-3}$ to $10^{-4}$ Torr and typically an arc current of about 100 AH and a bias voltage of about 30 V.

As to the other vapor phase plating techniques, conventional procedures may be used.

In any of vapor phase plating techniques, the thickness of the meal layer deposited on the network plastic substrate may be selected depending on the intended application of the electrode as well as the thickness, voids and pore diameter of the network plastic substrate. Often the metal layer is 5 to 20 $\mu$m thick, preferably 5 to 10 $\mu$m thick.

An electrode-active material is then carried on the thus prepared support to complete the electrode of the invention. The active material may be carried on the metal surface covering the lattice surface of the network plastic substrate. If desired, the network plastic substrate is removed from the metallized porous product to form a metallized porous cage whose lattices consist of the metal layer, that is, a porous support consisting of the metal and having the same lattice structure as the network plastic substrate. The active material may be carried on this porous metal support.

The method of removing the network plastic substrate from the metallized porous product may be suitably selected in accordance with the type of the plastic (melting temperature, thermal decomposition temperature, chemical solubility or the like). For example, the plastic substrate may be removed by melting or thermal decomposition or by dissolving in a suitable organic solvent. In order to dissolve away the plastic with an organic solvent, the metal layer covering the lattice surface of the substrate must contain more or less pinholes to allow the solvent to penetrate. To this end, a metal layer is thinly formed, the plastic substrate is dissolved away with an organic solvent, and metal deposition by the arc ion plating technique is carried out again until the metal layer reaches a desired thickness.

The plate-active material borne on the support may be suitably selected in accordance with the intended application of the electrode. When the electrode is used as a positive electrode in a secondary lithium cell, manganese dioxide, cobalt oxide and titanium sulfide are used as the active material, with conductive polymers and other known positive plate-active material being useful. For secondary lithium ion cells, lithium-metal complex oxide such as $LiCoO_2$ can be carried on the present aluminum carrier and graphite carbon can be carried on the present copper carrier. Depending on the type of the cell, any desired active material may be carried on the support to form a positive or negative electrode for cells other than the lithium cell. Alternatively, various enzymes may be carried on the support to form various sensor electrodes.

In general, the active material is blended with a binder together with an electrically conductive agent such as graphite and carbon to form an active material composition with which the support is filled, resulting in the support carrying the active material on. The electrode thus prepared, especially the electrode having the metal layer formed by an arc ion plating technique has improved performance and reliability because of improved adhesion between the active material and the support. When used in a cell, especially a secondary lithium cell and a secondary lithium ion cell, the electrode experiences uniform deterioration of the active material over the entire area thereof as the charge-discharge cycle is repeated. As a result, the electrode is increased in the number of repeatable charge-discharge cycles. This also ensures fabrication of cells of consistent quality. In addition, the amounts of the conductive agent and binder used can be reduced to thereby improve discharge electric capacity and electric power.

The electrode of the invention is useful for use in cells, especially secondary lithium cells and secondary lithium ion cells. The electrode may have any desired shape including a plate, a block, and a roll shape obtained by spirally winding plates, depending on the shape of the cell in which it is used. By interposing an electrolyte between the positive and negative electrodes, there is completed a cell.

For secondary lithium cells, the positive electrode based on the electrode of the invention uses the above-mentioned active materials while the negative electrode may use lithium-containing active materials, for example, well-known negative plate-active materials such as metallic lithium and lithium alloys with Al, In, Sn, Pb, Bi, Cd or Zn.

The electrolyte used in the secondary cell of the invention may be any desired nonaqueous substance which is chemicaly stable to the positive and negative electrode active materials and allows lithium ions to migrate for electrochemical reaction with the positive and negative electrode active materials. Some illustrative examples of the electrolyte are $LiPF_6$, $AiAsF_6$, $LiSbF_6$, $LiBF_4$, $LiClO_4$, $LiI$, $LiBr$, $LiCl$, $LiAlCl_4$, $LiHF_2$, $LiSCN$, $LiSO_3CF_3$, and the like.

These electrolytes are generally used in solution form by dissolving the solvents. The solvents are not particularly limited although preferred solvents used herein are relatively highly polar solvents. Examples include cyclic carbonates such as propylene carbonate, ethylene carbonate, and butylene carbonate; non-cyclic carbonates such as diethyl carbonate and dibutyl carbonate; glymes such as tetrahydrofuran, 2-methyltetrahydrofuran, dioxolan, dimethoxyethane, and diethylene glycol dimethyl ether; lactones such as $\gamma$-butyrolactone; phosphate esters such as triethyl phosphate; borate esters such as triethyl borate; sulfur compounds such as sulfolane and dimethyl sulfoxide; nitriles such as acetonitrile; amides such as dimethylformamide and dimethylacetamide; dimethyl sulfate, nitromethane, nitrobenzene, dichloroethane, and mixtures thereof.

The secondary cell of the invention is generally constructed by interposing the electrolyte solution between the positive and negative electrodes. If desired, a separator may be interposed between the positive and negative electrodes in order to prevent the electrodes from contacting each other to cause current shortcircuit. The separtor is preferably a porous material which can be impregnated with and allow passage of the electrolyte, for example, woven and non-woven fabrics and nets of synthetic resins such as polytetrafluoroethylene, polyethylene, and polypropylene.

The cell of the present invention may be of any desired types including cylindrical cells with a spiral structure, coin, button, and paper types.

EXAMPLE

Examples of the invention are given below by way of illustration and not by way of limitation.

Preparation 1

Using an arc ion plating technique, aluminum was deposited on a polyurethane foam plate of 2 mm thick containing 80 pores/inch. The arc ion plating conditions included a vacuum of $10^{-4}$ Torr, an arc current of 100 AH and a time of 20 minutes.

It was found that an aluminum film of about 10 $\mu$m thick covered the entire lattice surface of the polyurethane foam to the deepest core.

Preparation 2

Using the same arc ion plating technique a in Preparation 1, aluminum was deposited on a polypropylene fiber non-woven fabric of 1.5 mm thick having a porosity of 15%. An aluminum film of about 10 $\mu$m thick covered the entire lattice surface of the non-woven fabric.

Then the aluminized non-woven fabric was allowed to stand for 10 minutes in a heating furnace at 150° C., thereby melting away the majority of polypropylene filaments. It was then allowed to stand for 5 minutes in a heating furnace with a weakly oxidizing atmosphere at 250° C., thereby oxidizing off the residual polypropylene. There was obtained an aluminized plate consisting of aluminum and having the same lattice structure as the starting non-woven fabric.

Preparation 3

A metallic aluminum layer was deposited on polyester non-woven fabric (filament diameter about 12 $\mu$m, thickness 0.1 mm, weight 36 g/m$^2$) by either an arc ion plating technique or a vacuum deposition technique under the following conditions.

| Arc ion plating | |
|---|---|
| vacuum | $10^{-4}$ Torr |
| arc current | 100 AH |
| treating time | 20 minutes |
| Vacuum deposition | |
| vacuum | $1.5 \times 10^{-4}$ Torr |
| treating time | 20 minutes |

Figure 4:
FIG. 4 is a photomicrograph (×790) of polyester non-woven fabric.
Figure 5:
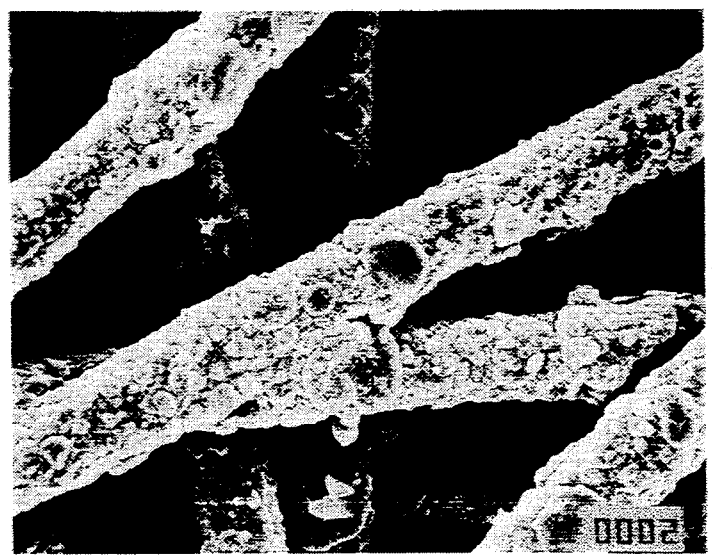
FIG. 5 is a photomicrograph (×790) of polyester non-woven fabric having an aluminum layer formed by arc ion plating.
Figure 6:
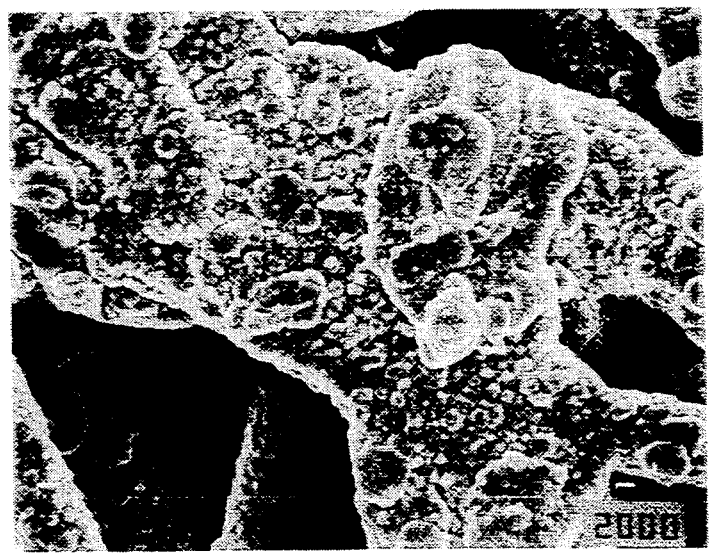
FIG. 6 is a photomicrograph (×4000) of polyester non-woven fabric having an aluminum layer formed by arc ion plating.
Figure 7:
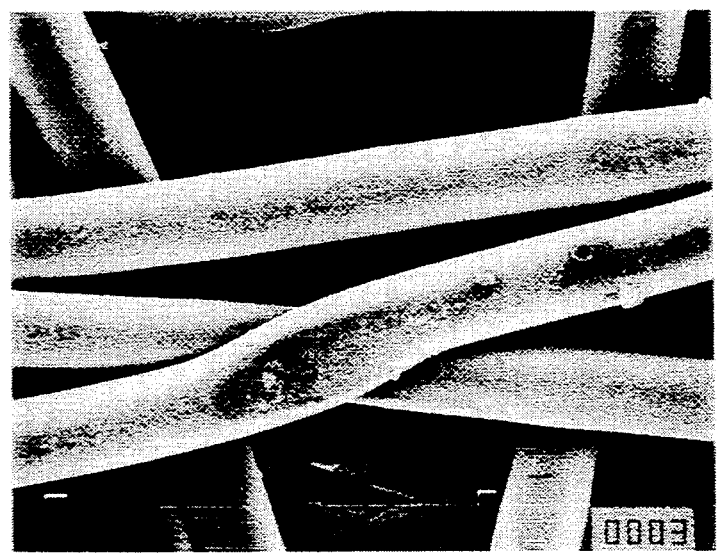
FIG. 7 is a photomicrograph (×790) of polyester non-woven fabric having an aluminum layer formed by vacuum deposition.

FIGS. 4 to 7 are photomicrographs of the metallic aluminum layers thus deposited. FIG. 4 is a photomicrograph (magnifying power $\times$ 790) of the starting polyester fabric. FIGS. 5 and 6 are photomicrographs (magnifying power $\times$ 790 and $\times$ 4000) of the metallic aluminum layer by arc ion plating, respectively. FIG. 7 is a photomicrograph (magnifying power $\times$ 790) of the metallic aluminum layer by vacuum deposition.

As is evident from FIGS. 4 to 7, the deposition rate of aluminum by the arc ion plating is remarkably high as compared with that by the vacuum deposition. As seen from FIGS. 4, 5 and 7 which are photomicrographs with the same magnifying power, the aluminized filament by arc ion plating in FIG. 5 is significantly thicker than the others. In practice, the aluminum deposits by arc ion plating and vacuum deposition had a surface resistance of $1.08 \times 10^{-2}$ $\Omega$/cm$^2$ and $4.07 \times 10^{-2}$ $\Omega$/cm$^2$, respectively. This comparison infers a difference in deposited aluminum thickness due to a difference in deposition rate. Since the aluminum layer by arc ion plating was dense, it had a lower surface resistance than the aluminum layer by vacuum deposition when compared at an equal thickness.

Next the adhesion of an aluminum deposit to polyester non-woven fabric was examined by the following tests for both the aluminum deposits which were formed by arc ion plating and vacuum deposition. The aluminum deposit by arc ion plating was found improved in adhesion to the substrate.

(1) Bend test

Test pieces were prepared by depositing metallic aluminum on polyester non-woven fabric by arc ion plating and vacuum deposition under the conditions of Preparation 3. A 180° bend test was carried out by bending the test piece 10 times on each surface side (total 20 bends) and examining the adhesion between the aluminum coating and the fabric at the bend. The test piece by arc ion plating experienced little separation between the aluminum coating and the fabric whereas the aluminum coating partially powdered in the test piece by vacuum deposition.

(2) Tape test

The same test pieces as above and the uncoated fabric were subjected to a tape test by applying commercially available adhesive tape to the test piece and stripping the tape therefrom at 90°. The amounts of filaments and aluminum powder adhered to the tape were measured using a $\times$ 40 magnifying glass. The results are shown in Table 1. It is to be noted that the amount of filaments adhered to the tape was evaluated on the basis of 100 for the uncoated fabric.

TABLE 1

| | Filaments adhered | Aluminum powder adhered (/cm$^2$) |
|---|---|---|
| Uncoated fabric | 100 | — |
| Arc ion plated piece | 15 | $\leq 3$ |
| Vacuum deposited piece | 40 | 15–20 |

EXAMPLE 1

Using a system as shown in FIG. 1, aluminum was deposited on polyester non-woven fabric (thickness 0.1 mm, average pore diameter 50 $\mu$m) by an arc ion plating technique. There was obtained a support in which an aluminum layer of about 10 $\mu$m thick covered the entire lattice surface of the polyester non-woven fabric.

Figure 8:
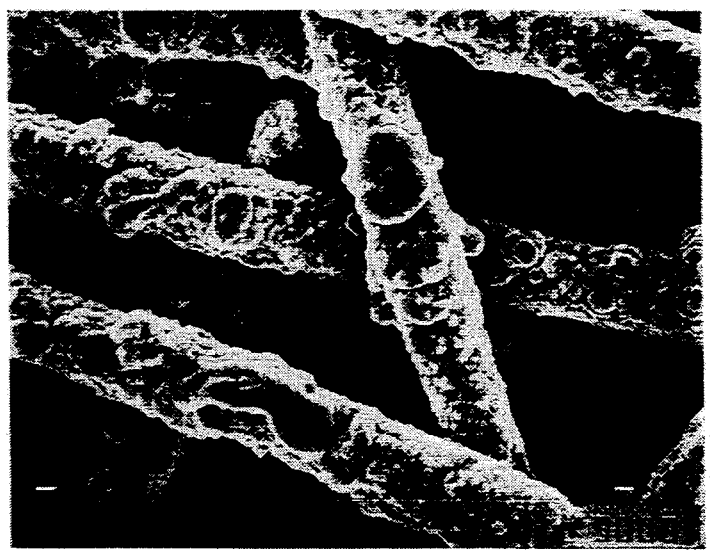
FIG. 8 is an electron photomicrograph (×790) of polyester non-woven fabric (network plastic substrate) having an aluminum layer formed on the surface of its filaments (lattice) by arc ion plating.

FIG. 8 is an electron photomicrograph ($\times$ 790) showing a surface of the support. As seen from FIG. 8, the aluminum layer roughly formed on the entire filament surface of the polyester non-woven fabric.

Active material, manganese dioxide containing lithium, was blended with 2% by weight of polyvinyl alcohol and 5% by weight of carbon powder. The support was filled and coated with this blend in an amount of 2 grams per square decimeter, obtaining a positive electrode for a secondary lithium cell.

The electrode was subjected to a tape test by applying commercially available adhesive tape to the electrode and stripping the tape there from at 90° for evaluating the adhesion between the support and the active material. The result is shown in Table 2.

The electrode was cut to a size of 50×200 mm. It was laid on a metallic lithium plate of 50×200×0.1 mm as a negative electrode through a polyester non-woven fabric as a separator and spirally wound into a roll. The roll was impregnated with an electrolyte solution containing 10% by weight of $LiClO_4$ in a solvent mixture of propylene carbonate (PC) and 1,2-dimethoxyethane (DME) in a ratio PC:DME=50:50 between the positive and negative electrodes, completing a roll-shaped secondary lithium cell. The cell was measured for discharge electric capacity and electric power. The results are shown in Table 3.

EXAMPLE 2

Figure 9:
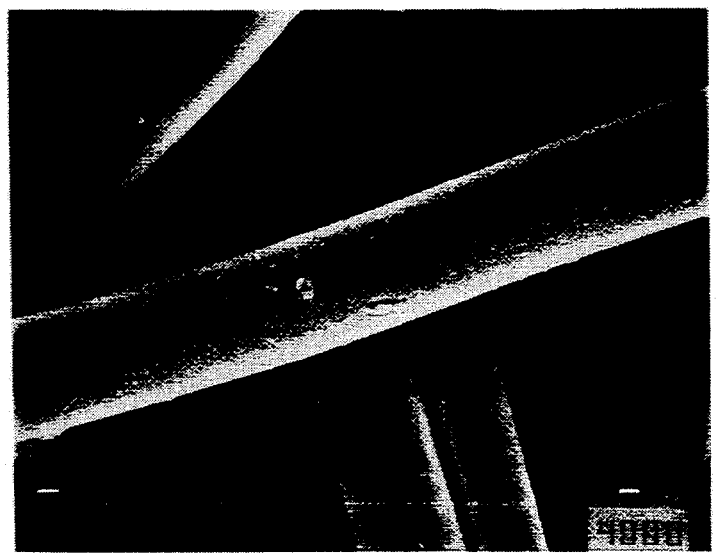
FIG. 9 is an electron photomicrograph (×790) of polyester non-woven fabric (network plastic substrate) having an aluminum layer formed on the surface of its filaments (lattice) by vacuum deposition.

A support was prepared by the same procedure as in Example 1 except that the aluminum layer was formed by a conventional vacuum deposition technique instead of the arc ion plating technique. FIG. 9 is an electron photomicrograph (×790) showing a surface of the support. As seen from FIG. 9, the aluminum layer evenly formed on the entire filament surface of the polyester non-woven fabric.

By applying the active material to the support in the same manner as in Example 1, there was obtained a positive electrode for a secondary lithium cell. The electrode was tested for adhesion between the support and the active material as in Example 1. The result is shown in Table 2.

Using the positive electrode, a secondary lithium cell was fabricated as in Example 1. The cell was measured for discharge electric capacity and electric power. The results are shown in Table 3.

Comparative Example 1

An aluminum plate of 80 μm thick was coated on both the surfaces with the same active material in the same amount as in Example 1 and dried in vacuum at 120° C. for one hour, obtaining a positive electrode for a secondary lithium cell. The electrode was tested for adhesion between the support (aluminum plate) and the active material as in Example 1. The result is shown in Table 2.

Using the positive electrode, a secondary lithium cell was fabricated as in Example 1. The cell was measured for discharge electric capacity and electric power. The results are shown in Table 3.

TABLE 2

| Example 1 | little stripping |
|---|---|
| Example 2 | partial stripping of blocks |
| Comparative Example 1 | stripping over a wide area or entirely |

As seen from Table 2, the inventive electrodes are improved in support-active material adhesion over the prior art electrode.

TABLE 3

|  | Discharge electric capacity | Electric power |
|---|---|---|
| Example 1 | 115 | 122 |
| Example 2 | 108 | 110 |
| Comparative Example 1 | 100 | 100 |

*The capacity and power were calculated based on a capacity and power of 100 for the cell of Comparative Example 1, respectively.

As seen from Table 3, the secondary lithium cells using the inventive electrodes as the positive electrode have a higher discharge electric capacity and electric power than the prior art cell.

EXAMPLE 3

Polyester non-woven fabric (filament diameter 12 μm, thickness 0.1 mm, weight 36 $g/m^2$) was coated with aluminum to a thickness of about 10 μm by arc ion plating, obtaining an aluminized porous product. Separately, the same non-woven fabric was coated with copper first by sputtering to a thickness of about 500 Å and then by electrolytic plating in a copper sulfate bath to a thickness of about 10 μm, obtaining a copper coated porous product.

Using the aluminized porous product as a support for a positive electrode and the copper coated porous product as a support for a negative electrode, a secondary lithium ion cell was fabricated. The positive electrode active material was $LiCoO_2$, the negative electrode active material was graphite, the separator was a polyolefin film containing numerous pores of submicron order, and the electrolyte was the same as in Example 1.

For comparison purposes, a secondary lithium ion cell (prior art cell) was fabricated as above except that the positive electrode support was an aluminum foil of 80 μm thick and the negative electrode support was a copper foil of 80 μm.

These cells were compared for performance, with the results shown in Table 4.

TABLE 4

|  | Cell Performance | |
|---|---|---|
|  | Discharge electric capacity | Electric power |
| Example 3 | 105 | 110 |
| Prior art cell | 100 | 100 |

*The capacity and power were calculated based on a capacity and power of 100 for the prior art cell, respectively.

It will be understood that the above tests compared the cells with the same amount of active material. The use of a porous support according to the invention allows the amount of active material applied to or incorporated in the support to be increased by a factor of 10 or more as compared with conventional sheet-shaped supports, implying substantial improvements in cell performance.

There has been described an electrode which is improved in adhesion between an active material and a support, allows the amounts of conductive agent and binder to be reduced, and provides a cell, especially a secondary lithium cell, with improved performance. The electrode is thus useful as a cell-forming electrode.

We claim:

1. An electrode comprising
    a support prepared by depositing aluminum on a three-dimensional network plastic substrate having internal open cells and having a three-dimensional network lattice surface by a vapor phase plating technique to form an aluminum layer covering all of the three-dimensional network lattice surface extending from the outside surface to the deepest center of the substrate and an active material borne on the support.

2. The electrode of claim 1 wherein the vapor phase plating technique is arc ion plating.

3. The electrode of claim 1, wherein the network plastic substrate has an average pore diameter of 50 to 100 $\mu$m.

4. An electrode comprising a support prepared by depositing aluminum on a three-dimensional network plastic substrate having internal open cells and having a three-dimensional network lattice surface by a vapor phase plating technique to form an aluminum layer covering all of the three-dimensional network lattice surface extending from the outside surface to the deepest center of the substrate and removing the substrate, and an active material borne on the support.

5. The electrode of claim 2 wherein the vapor phase plating technique is arc ion plating.

6. The electrode of claim 4, wherein the network plastic substrate has an average pore diameter of 50 to 100 $\mu$m 7. A secondary cell comprising a positive electrode, a negative electrode and an electrolyte, wherein the positive electrode is composed of a positive active material carried on a support prepared by depositing aluminum on a three-dimensional network plastic substrate having internal open cells and having a three-dimensional network lattice surface by a vapor phase plating technique to form an aluminum layer covering all of the three-dimensional network lattice surface extending from the outside surface to the deepest center of the substrate.

8. The cell of claim 7, wherein the aluminum layer is formed by arc ion plating.

9. The cell of claim 7, wherein the network plastic substrate has an average pore diameter of 50 to 100 $\mu$m.

* * * * *